(12) United States Patent
Terada

(10) Patent No.: US 11,311,976 B2
(45) Date of Patent: Apr. 26, 2022

(54) CUTTING APPARATUS

(71) Applicant: DISCO CORPORATION, Tokyo (JP)

(72) Inventor: Kazuki Terada, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 712 days.

(21) Appl. No.: 16/353,574

(22) Filed: Mar. 14, 2019

(65) Prior Publication Data

US 2019/0283195 A1    Sep. 19, 2019

(30) Foreign Application Priority Data

Mar. 19, 2018 (JP) .............................. JP2018-051164

(51) Int. Cl.
| | | |
|---|---|---|
| *B23Q 3/155* | (2006.01) | |
| *B26D 7/26* | (2006.01) | |
| *B26D 5/22* | (2006.01) | |
| *H01L 21/304* | (2006.01) | |
| *B23D 35/00* | (2006.01) | |

(52) U.S. Cl.
CPC .............. *B23Q 3/155* (2013.01); *B26D 5/22* (2013.01); *B26D 7/2614* (2013.01); *H01L 21/304* (2013.01); *B23D 35/008* (2013.01)

(58) Field of Classification Search
CPC .............. B23Q 31/155; B23Q 3/15713; B28D 5/0047; B28D 5/024; B28D 5/022; B26D 7/2614; B26D 5/22; B26D 7/08; B26D 1/16; B23D 35/008; H01L 21/304; H01L 21/67092; H01L 22/12; H01L 22/20; H01L 21/67259; H01L 21/6838; B24B 41/068; B26S 7/2621

USPC ....... 83/43, 597, 613, 569, 884–887, 27, 28, 83/31, 36, 290, 745, 698.11, 922, 923, 83/74, 76.7, 367, 880, 75, 452, 76.8, 83/477.1; 125/13.02, 13.01, 15, 16.01, 125/16.02, 18, 21, 23.01, 23.02; 483/14,
(Continued)

(56) References Cited

U.S. PATENT DOCUMENTS

2008/0313875 A1* 12/2008 Tomooka .................. B25B 9/02
                                                              29/270
2016/0346956 A1* 12/2016 Takekawa .......... B23Q 17/0971
(Continued)

FOREIGN PATENT DOCUMENTS

| JP | 06326186 A | 11/1994 |
|---|---|---|
| JP | 2007208114 A | 8/2007 |

*Primary Examiner* — Ghassem Alie
(74) *Attorney, Agent, or Firm* — Greer Burns & Crain Ltd.

(57) ABSTRACT

A cutting apparatus includes a blade changing apparatus. The blade changing apparatus includes a blade mounting and removal portion, which in turn includes: a holding portion that removably holds a circular base of a cutting blade; a moving support portion that supports the holding portion and moves the holding portion to a removal and mounting position at which an insertion hole in the blade faces a boss of a blade mount; and a coupling mechanism that couples the holding portion with the moving support portion such that the holding portion is freely tiltable with respect to the moving support portion. The coupling mechanism includes a plurality of elastic member pairs, each pair, while tensioning the holding portion in opposite directions, fixing the holding portion to the moving support portion. Forces acting from the elastic member pairs balance each other to thereby support the holding portion tiltably and aerially.

9 Claims, 12 Drawing Sheets

(58) Field of Classification Search
USPC ........ 483/160, 400, 386, 409; 451/5, 6, 551; 156/510
See application file for complete search history.

(56) References Cited

U.S. PATENT DOCUMENTS

| | | | |
|---|---|---|---|
| 2019/0001526 A1* | 1/2019 | Sekiya | B28D 5/022 |
| 2020/0030928 A1* | 1/2020 | Terada | B28D 5/0076 |
| 2020/0398452 A1* | 12/2020 | Terada | B26D 1/15 |

* cited by examiner

CUTTING APPARATUS

BACKGROUND OF THE INVENTION

Field of the Invention

The present invention relates to a cutting apparatus including a blade changing apparatus.

Description of the Related Art

A known cutting apparatus incorporates a cutting blade that cuts a plate-shaped workpiece, such as a semiconductor wafer and an optical device wafer having a front surface on which a plurality of devices are formed, and a resin package substrate, into divided chips. The cutting blade needs replacement at regular intervals because a cutting edge of the cutting blade wears out through use.

A cutting blade replacement procedure typically includes insertion of the cutting blade into a boss of a blade mount disposed at a distal end of a spindle of the cutting apparatus and fixing of the cutting blade with a fixing nut. Fitting the cutting blade into the boss of the blade mount requires a certain level of skill. A cutting blade, if inserted obliquely, can damage the blade mount or can be fixed in an oblique position, resulting in incorrect cutting.

An approach to solve the foregoing problem has led to development of an automatic blade changing apparatus that mechanically changes the cutting blades (see, for example, Japanese Patent No. 2617876 and Japanese Patent Laid-open No. 2007-208114). The automatic blade changing apparatus has enabled quick replacement of the cutting blade.

SUMMARY OF THE INVENTION

The known automatic blade changing apparatus, however, requires an accurate positional adjustment through which an axis of a holding portion of the automatic blade changing apparatus for mounting the cutting blade in, or removing the cutting blade from, the boss of the blade mount is in complete alignment with an axis of the boss along a single straight line. This positional adjustment involves a heavy workload.

It is therefore an object of the present invention to provide a cutting apparatus including a blade changing apparatus that can mount or remove quickly and reliably a cutting blade in or from a blade mount disposed at a distal end of a spindle.

In accordance with an aspect of the present invention, there is provided a cutting apparatus. The cutting apparatus includes: a cutting unit that cuts a workpiece held by a chuck table with a cutting blade fixed to a blade mount mounted at a distal end of a spindle; a moving mechanism that moves the cutting unit in an axial direction of the spindle; and a blade changing apparatus that removes the cutting blade from, and mounts the cutting blade on, the blade mount to thereby exchange the cutting blades, the cutting blade including a circular base having an insertion hole at a center thereof and a cutting edge fixed to an outer circumferential edge of the circular base. The blade mount includes: a boss that is passed through the insertion hole in the cutting blade and extends in the axial direction of the spindle; and a flange that integrally protrudes in a radial direction from the boss at a position posterior to the boss and on which the cutting blade abuts. The blade changing apparatus includes a blade mounting and removal portion that includes: a first holding portion that removably holds the circular base of the cutting blade; a moving support portion that supports the first holding portion and moves the first holding portion to a removal and mounting position at which the insertion hole in the cutting blade faces the boss of the blade mount; and a first coupling mechanism that couples the first holding portion with the moving support portion such that the first holding portion is freely tiltable with respect to the moving support portion. The first coupling mechanism includes a plurality of first elastic member pairs, each pair, while tensioning the first holding portion in opposite directions, fixing the first holding portion to the moving support portion, and forces acting from the first elastic member pairs balance each other to thereby support the first holding portion tiltably and aerially.

Preferably, the blade changing apparatus further includes a nut rotation portion that includes: a second holding portion that removably holds a fixing nut that fixes the cutting blade inserted in the boss of the blade mount to the boss; rotary means that is disposed in the moving support portion and that rotates the fixing nut fitted to the boss; and a second coupling mechanism that couples the second holding portion with the moving support portion freely tiltably with respect to the moving support portion.

Preferably, the first elastic member pairs each include a pair of coil springs as elastic members having bias forces identical to each other and tensioning in opposite directions. Preferably, the first holding portion includes a suction portion that suctions and holds the circular base of the cutting blade.

Preferably, the first coupling mechanism is such that the first holding portion has an axis at a position corresponding to a center in the insertion hole in the circular base of the cutting blade held in the first holding portion. Preferably, the fixing nut has a plurality of pin holes, and the second holding portion of the nut rotation portion includes a plurality of pins that can be inserted in the pin holes in the fixing nut.

In accordance with the cutting apparatus including the blade changing apparatus, the first holding portion of the blade changing apparatus for holding the circular base of the cutting blade is coupled with the first moving portion freely tiltably by the first coupling mechanism. Thus, even when the cutting blade held through clamping or suction by the first holding portion tilts slightly relative to the boss of the blade mount, an angle of the cutting blade is adjusted with no special intervention so as to follow a profile of the boss when the insertion hole in the cutting blade is mounted over the boss, so that the cutting blade can be reliably mounted on the blade mount.

When the fixing nut is mounted on, or removed from, the boss of the blade mount using the nut rotation portion of the blade changing apparatus, because of the second holding portion being coupled with the second moving portion by the second coupling mechanism, even when the fixing nut fixed by the second holding portion tilts slightly relative to the boss of the blade mount, an angle of the fixing nut is adjusted with no special intervention so as to follow the profile of the boss when the fixing nut is mounted over the boss, so that the fixing nut can be reliably mounted on the boss of the blade mount.

The above and other objects, features, and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Figure 1:
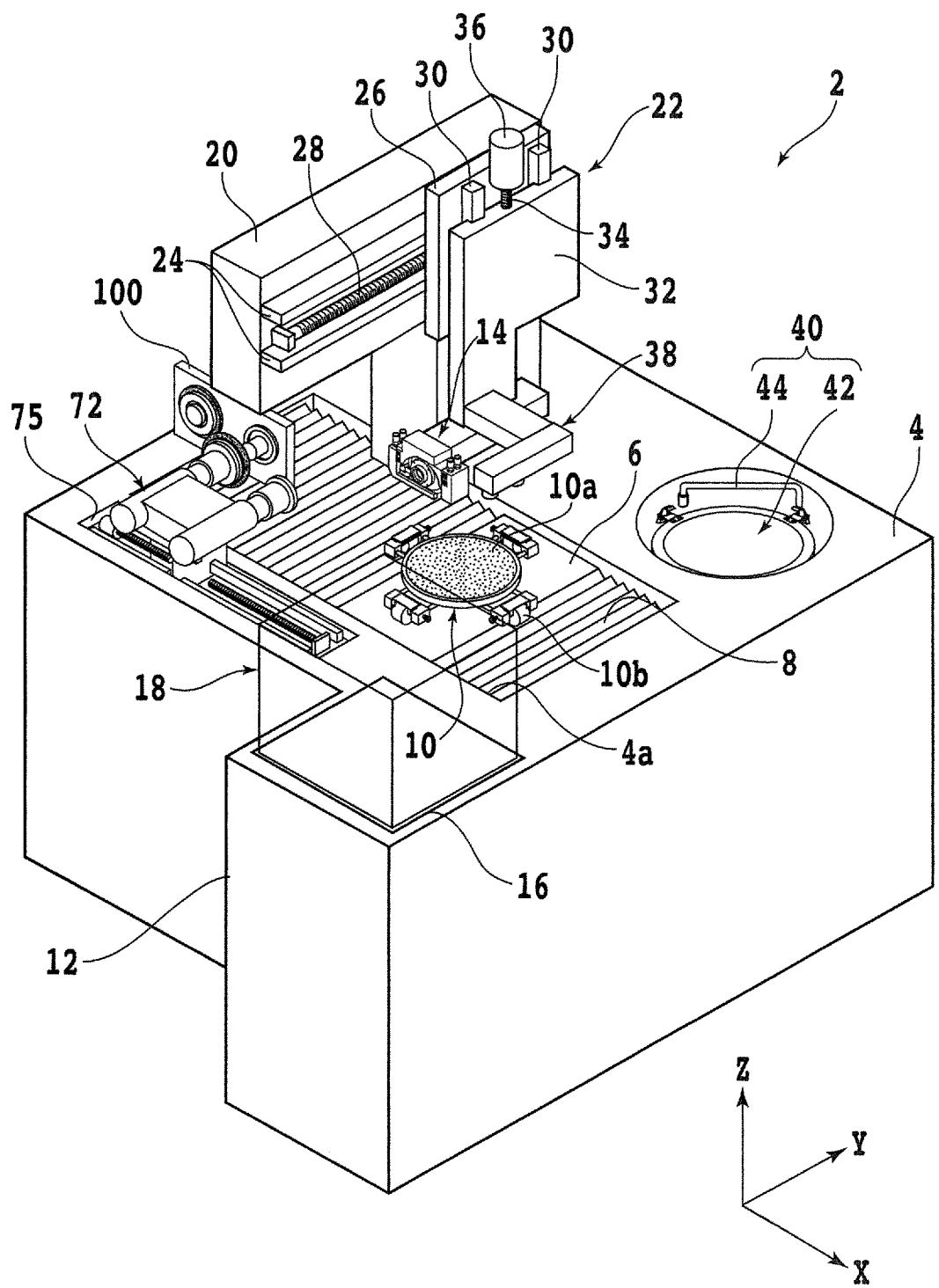
FIG. 1 is a perspective view depicting a cutting apparatus according to an embodiment of the present invention.

Embodiments of the present invention will be described in detail below with reference to the accompanying drawings. FIG. 1 is a perspective view depicting a cutting apparatus 2 including a blade changing apparatus 72 according to an embodiment of the present invention. As depicted in FIG. 1, the cutting apparatus 2 includes an apparatus base 4. The apparatus base 4 supports various elements constituting the cutting apparatus 2. The apparatus base 4 has an upper surface having an opening 4a formed therein. The opening 4a has a rectangular shape elongated in an X-axis direction (feeding direction).

An X-axis moving table 6, an X-axis moving mechanism (not depicted), and a dust-proof and drip-proof cover 8 are disposed inside the opening 4a. The X-axis moving mechanism moves the X-axis moving table 6 in the X-axis direction. The dust-proof and drip-proof cover 8 covers the X-axis moving mechanism. The X-axis moving mechanism includes a pair of X-axis guide rails (not depicted) that extend in parallel with each other in the X-axis direction. The X-axis moving table 6 is slidably mounted on the X-axis guide rails.

A nut portion (not depicted) is formed on the lower surface side of the X-axis moving table 6. An X-axis ball screw (not depicted) in parallel with the X-axis guide rails is threadedly engaged with this nut portion. The X-axis ball screw has a first end coupled with an X-axis pulse motor (not depicted). Rotation of the X-axis ball screw by the X-axis pulse motor causes the X-axis moving table 6 to move along the X-axis guide rails in the X-axis direction.

A chuck table 10 is disposed on the X-axis moving table 6. The chuck table 10 suctions and holds a workpiece. The chuck table 10 is coupled with a rotational drive source (not depicted), such as a motor, and is rotated about a rotary axis that extends substantially in parallel with a Z-axis direction (vertical direction). The chuck table 10 is also fed in the X-axis direction by the X-axis moving mechanism.

The chuck table 10 has a front surface (upper surface) that assumes a holding surface 10a, which suctions and holds the workpiece. The holding surface 10a is connected with a suction source (not depicted) through a flow passage (not depicted) formed inside the chuck table 10. The chuck table 10 is provided with clamps 10b. The clamps 10b are disposed around the chuck table 10 and fix the workpiece in place.

The workpiece is, for example, a semiconductor wafer that is affixed to a tape held on an annular frame and is handled with the annular frame. The handling of the workpiece with the annular frame and the tape allows the workpiece to be protected from, for example, impact during conveyance. Additionally, expanding the tape allows a workpiece that has been cut to be divided and allows an interval between divided chips to be widened. It is noted that nevertheless the workpiece may be individually processed for cutting without the use of the annular frame and the tape.

The apparatus base 4 has a protruding portion 12 at an anterior corner away from the opening 4a. The protruding portion 12 protrudes laterally from the apparatus base 4. A space is defined inside the protruding portion 12. A cassette elevator 16 is disposed in the space. The cassette elevator 16 can ascend and descend. A cassette 18, which can house a plurality of workpieces, is loaded on an upper surface of the cassette elevator 16.

A conveyance unit (not depicted) that conveys the workpiece onto the chuck table 10 is disposed at a position close to the opening 4a. A workpiece withdrawn from the cassette 18 by the conveyance unit is placed on the holding surface 10a of the chuck table 10.

A support structure 20 is disposed on the upper surface of the apparatus base 4 so as to overhang the opening 4a. The support structure 20 supports a cutting unit 14, which cut the workpiece. A cutting unit moving mechanism 22 is disposed at an upper portion of a front surface of the support structure 20. The cutting unit moving mechanism 22 moves the cutting unit 14 in a Y-axis direction (indexing direction) and the Z-axis direction.

The cutting unit moving mechanism 22 is provided with a pair of Y-axis guide rails 24. The Y-axis guide rails 24 are disposed on the front surface of the support structure 20 so as to extend in parallel with the Y-axis direction. A Y-axis moving plate 26 is slidably mounted on the Y-axis guide rails 24. The Y-axis moving plate 26 constitutes the cutting unit moving mechanism 22. A nut portion (not depicted) is disposed on the back surface side (posterior surface side) of the Y-axis moving plate 26. A Y-axis ball screw 28, which extends in parallel with the Y-axis guide rails 24, is threadedly engaged with this nut portion.

The Y-axis ball screw 28 has a first end coupled with a Y-axis pulse motor (not depicted). Rotation of the Y-axis ball screw 28 by the Y-axis pulse motor causes the Y-axis moving plate 26 to move along the Y-axis guide rails 24 in the Y-axis direction. A pair of Z-axis guide rails 30 is disposed on the front surface (anterior surface) of the Y-axis moving plate 26. The Z-axis guide rails 30 extend in parallel with the Z-axis direction. A Z-axis moving plate 32 is slidably mounted on the Z-axis guide rails 30.

A nut portion (not depicted) is disposed on the back surface side (posterior surface side) of the Z-axis moving plate 32. A Z-axis ball screw 34, which extends in parallel with the Z-axis guide rails 30, is threadedly engaged with this nut portion. The Z-axis ball screw 34 has a first end coupled with a Z-axis pulse motor 36. Rotation of the Z-axis ball screw 34 by the Z-axis pulse motor 36 causes the Z-axis moving plate 32 to move along the Z-axis guide rails 30 in the Z-axis direction.

The cutting unit 14, which cuts the workpiece, and an imaging unit 38 are fixed on the lower portion of the Z-axis moving plate 32. Movement of the Y-axis moving plate 26 in the Y-axis direction by the cutting unit moving mechanism 22 causes the cutting unit 14 and the imaging unit 38 to be indexed. Movement of the Z-axis moving plate 32 in the Z-axis direction by the cutting unit moving mechanism 22 causes the cutting unit 14 and the imaging unit 38 to ascend and descend.

Reference numeral 40 denotes a cleaning unit. The workpiece cut by the cutting unit 14 is conveyed by a conveyance mechanism (not depicted) from the chuck table 10 onto the cleaning unit 40. The cleaning unit 40 includes a spinner table 42. The spinner table 42 suctions and holds the workpiece in a tubular cleaning space. A rotational drive source that rotates the spinner table 42 at a predetermined speed, such as a motor, is coupled with a lower portion of the spinner table 42.

An injection nozzle 44 is disposed at a position superior to the spinner table 42. The injection nozzle 44 injects a cleaning fluid (typically, a binary fluid mixture of water and air) toward the workpiece. Injecting the cleaning fluid from the injection nozzle 44 at a cut workpiece held by a rotating spinner table 42 allows the workpiece to be cleaned. The workpiece cleaned by the cleaning unit 40 is housed in the cassette 18 by the conveyance mechanism (not depicted).

Figure 3A:
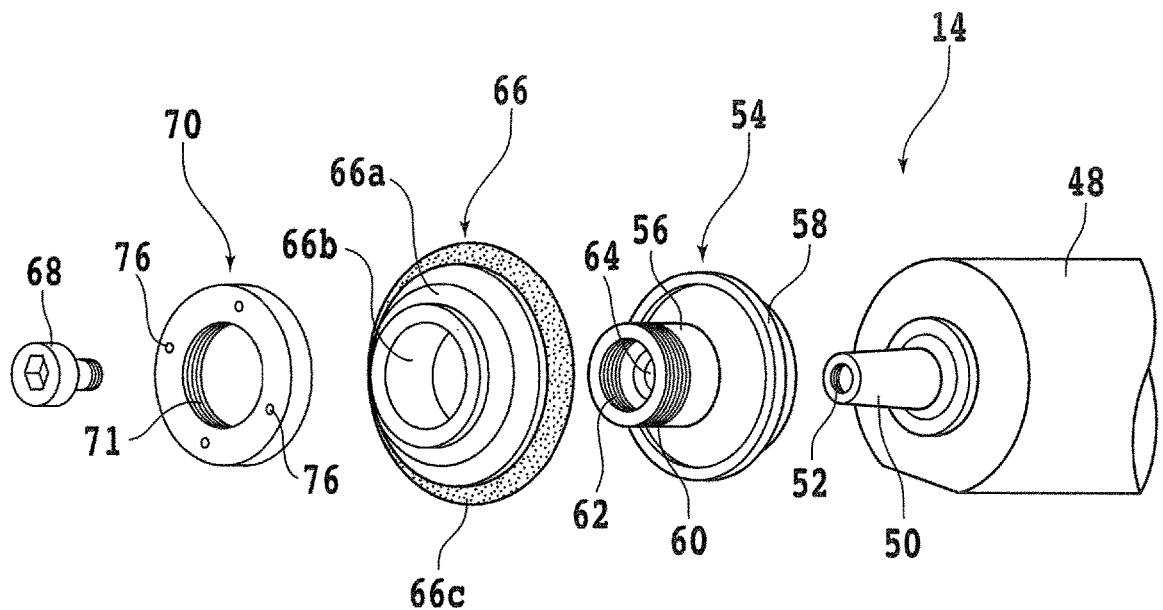
FIG. 3A is an exploded perspective view depicting a cutting unit.
Figure 3B:
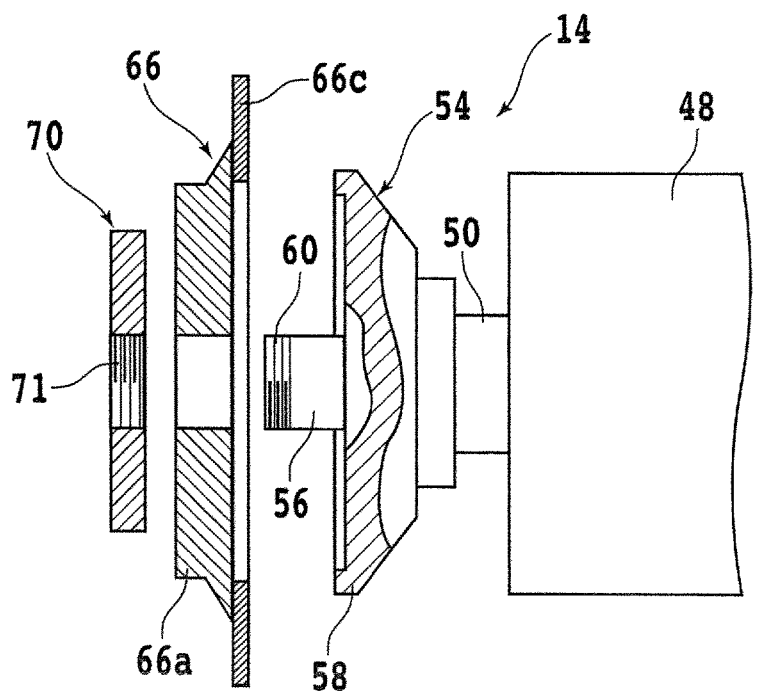
FIG. 3B is a partial cross-sectional side elevation view depicting the cutting unit.

As depicted in FIG. 3, the cutting unit 14 includes a spindle housed in a spindle housing 48. A spindle distal end portion 50, which has a small diameter, is formed into a taper having decreasing diameters toward the distal end. A threaded hole 52 is formed in an end face of the spindle distal end portion (spindle taper) 50.

Reference numeral 54 denotes a blade mount. The blade mount 54 includes a cylindrical boss 56 and a flange 58. The flange 58 integrally protrudes in a radial direction from the boss 56 at a position posterior to the boss 56. A cutting blade mounted in the boss 56 abuts on the flange 58.

An external thread 60 is formed in an outer periphery of the cylindrical boss 56 and an internal thread 62 is formed in an inner periphery of the cylindrical boss 56. The blade mount 54 further has a tapered engagement hole 64. Insert the spindle taper 50 in the engagement hole 64 in the blade mount 54 and threadedly engage a screw 68 with the threaded hole 52 through the engagement hole 64 in the blade mount 54. The blade mount 54 is thereby mounted on the spindle taper 50.

A cutting blade 66 is what is called a hub blade including a circular base 66a having an insertion hole 66b at a center thereof and an electroformed cutting edge 66c fixed on an outer periphery of the circular base 66a. Reference numeral 70 denotes a fixing nut. The fixing nut 70 has an internal thread 71 formed in an inner periphery thereof. The internal thread 71 is threadedly engaged with the external thread 60 formed in the boss 56 of the blade mount 54. The fixing nut 70 further has four pin holes 76 formed in a front surface thereof. Pins 164 of a nut rotation portion 86 depicted in FIG. 10 are fitted in the respective pin holes 76.

To mount the cutting blade 66 on the spindle, mount the cutting blade 66 over the boss 56 of the blade mount 54 and, while overlapping the fixing nut 70 with the cutting blade 66, threadedly engage the internal thread 71 of the fixing nut 70 with the external thread 60 formed in the boss 56 of the blade mount 54. Tightening the fixing nut 70 causes the cutting blade 66 to be mounted on the spindle taper 50 by being clamped between the flange 58 of the blade mount 54 and the fixing nut 70.

Reference is made back to FIG. 1. The apparatus base 4 has a recess 75 formed on the front side in the Y-axis direction. The recess 75 extends in the X-axis direction. The blade changing apparatus 72 is disposed in the recess 75. As depicted in the enlarged view of FIG. 2, a pair of guide rails 76, which extend in the X-axis direction, is fixed in the recess 75. The blade changing apparatus 72 is disposed so as to be guided by the guide rails 76 and movable in the X-axis direction by a blade changing apparatus moving mechanism 78.

The blade changing apparatus moving mechanism 78 includes a ball screw 80, a nut, and a pulse motor 82. The ball screw 80 extends in the X-axis direction. The nut, not depicted, is mounted on an X-axis moving block 74 (moving support portion) of the blade changing apparatus 72 and is threadedly engaged with the ball screw 80. The pulse motor 82 is coupled with one end of the ball screw 80.

When the pulse motor 82 of the blade changing apparatus moving mechanism 78 of the blade changing apparatus 72 is driven, the ball screw 80 is thereby rotated, so that the X-axis moving block 74 of the blade changing apparatus 72, on which the nut threadedly engaged with the ball screw 80 is mounted, moves in the X-axis direction.

The blade changing apparatus 72 further includes a pair of air cylinders 90 and 96, a blade mounting and removal portion 84, and the nut rotation portion 86. The air cylinders 90 and 96 are mounted on the X-axis moving block 74. The blade mounting and removal portion 84 is mounted on a piston (first moving portion) 92 of the air cylinder 90. The nut rotation portion 86 is mounted on a piston (second moving portion) 98 of the air cylinder 96. A motor is built in the second moving portion 98 of the air cylinder 96. The nut rotation portion 86 is thus configured to be movable in the Y-axis direction and rotatable by the motor.

Figure 2:
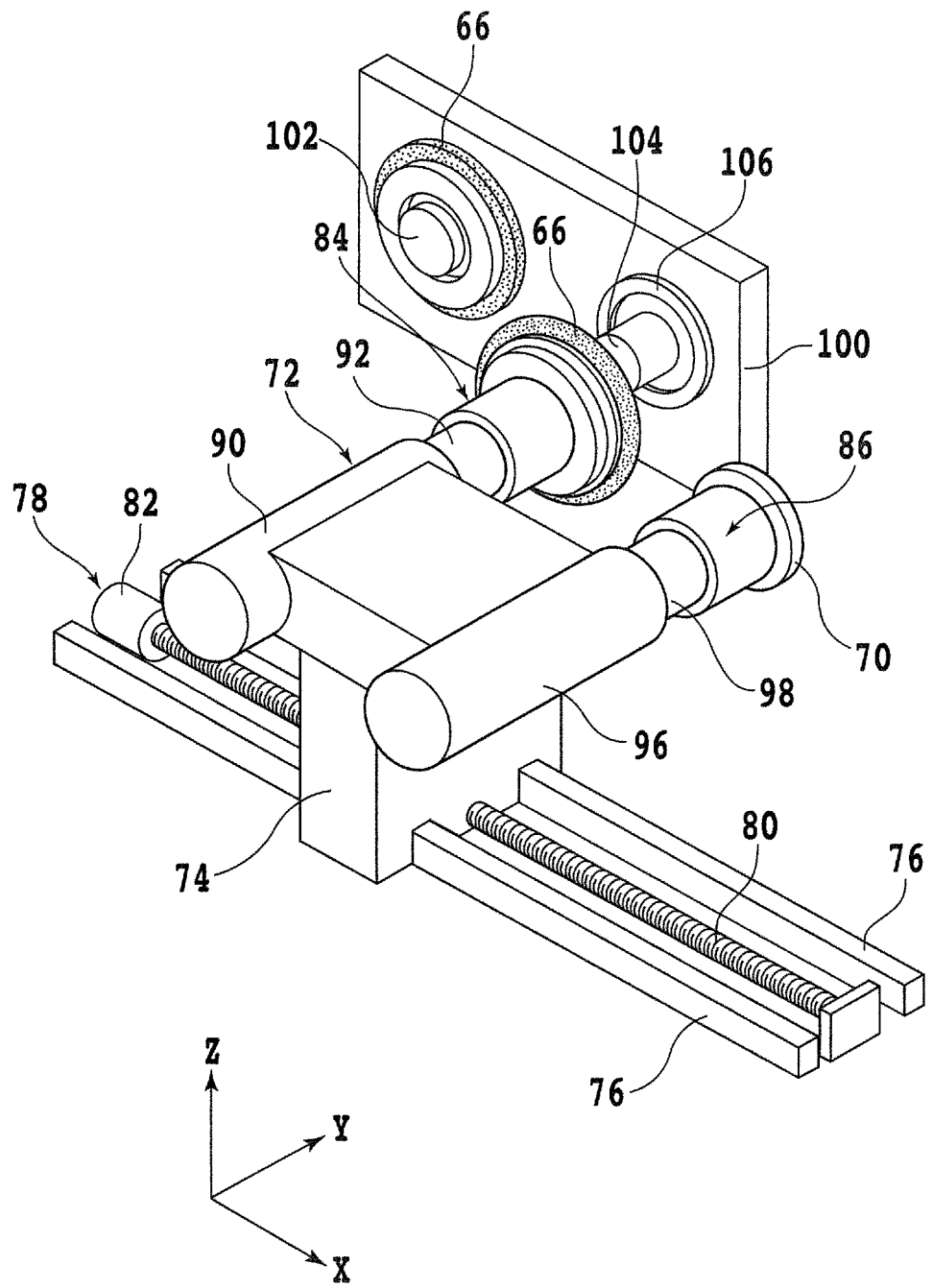
FIG. 2 is a perspective view depicting a blade changing apparatus.

A blade rack 100 is mounted on the apparatus base 4 so as to face the blade changing apparatus 72. As depicted in FIG. 2, a pair of cylindrical protrusions 102 and 104 is formed on the blade rack 100. The cylindrical protrusions 102 and 104 protrude from the blade rack 100. The cutting blade 66 is to be mounted on each of the cylindrical protrusions 102 and 104. A ring-shaped receiver 106 is disposed at a root of the cylindrical protrusion 104.

FIG. 2 depicts a condition in which a new cutting blade 66 is mounted on the cylindrical protrusion 102 of the blade rack 100 and another cutting blade 66 that is held by the blade mounting and removal portion 84 of the blade changing apparatus 72 and that is to be replaced by the new cutting blade 66 is about to be mounted on the cylindrical protrusion 104 of the blade rack 100. Upon changing the cutting blades 66, the nut rotation portion 86 of the blade changing apparatus 72 invariably holds the fixing nut 70 removed from the blade mount 54.

A detailed configuration of the blade changing apparatus 72 will be described below with reference to FIGS. 4 to 12B.

Figure 4:
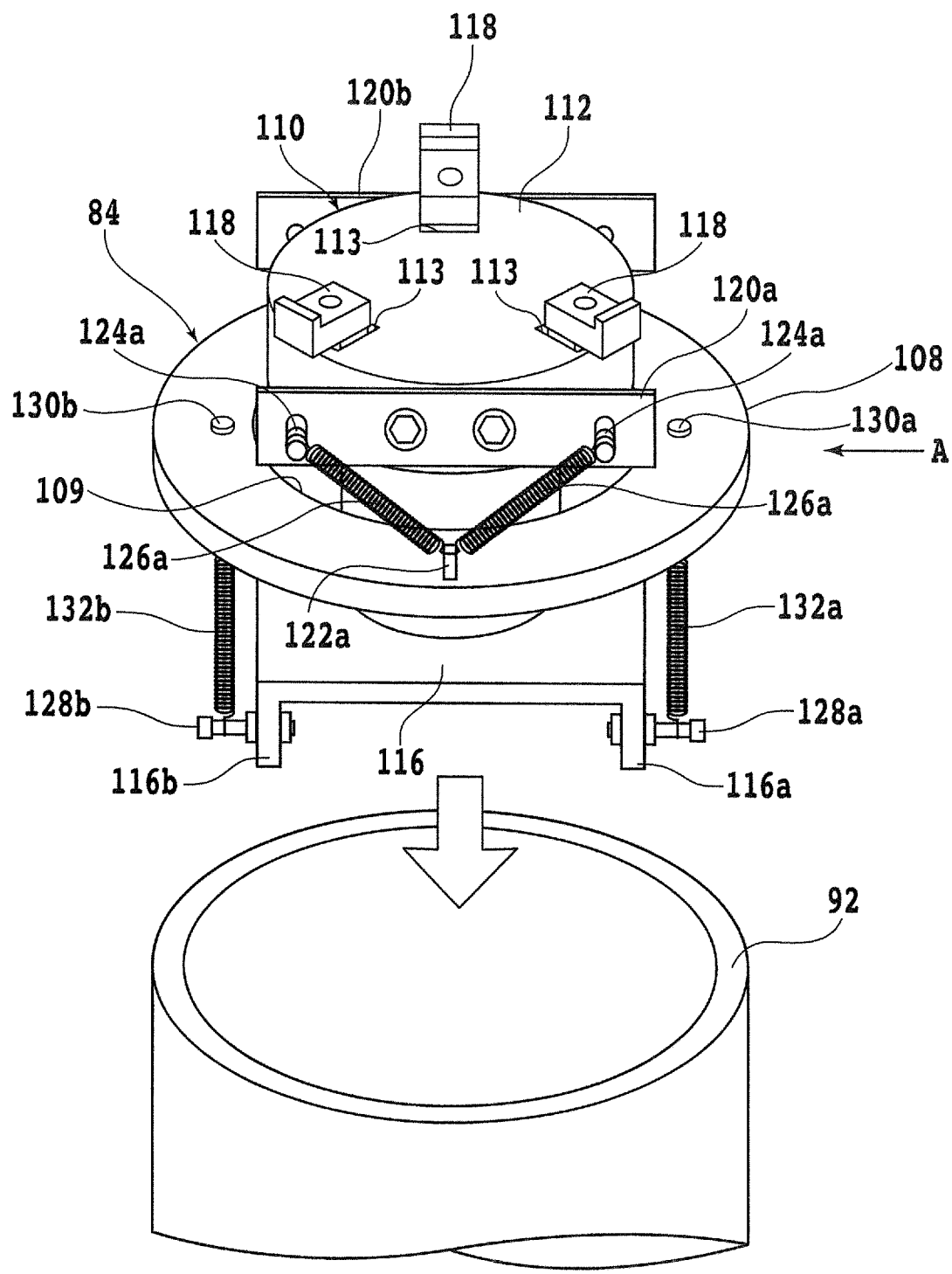
FIG. 4 is a perspective view depicting a blade mounting and removal portion according to a first embodiment.
Figure 5:
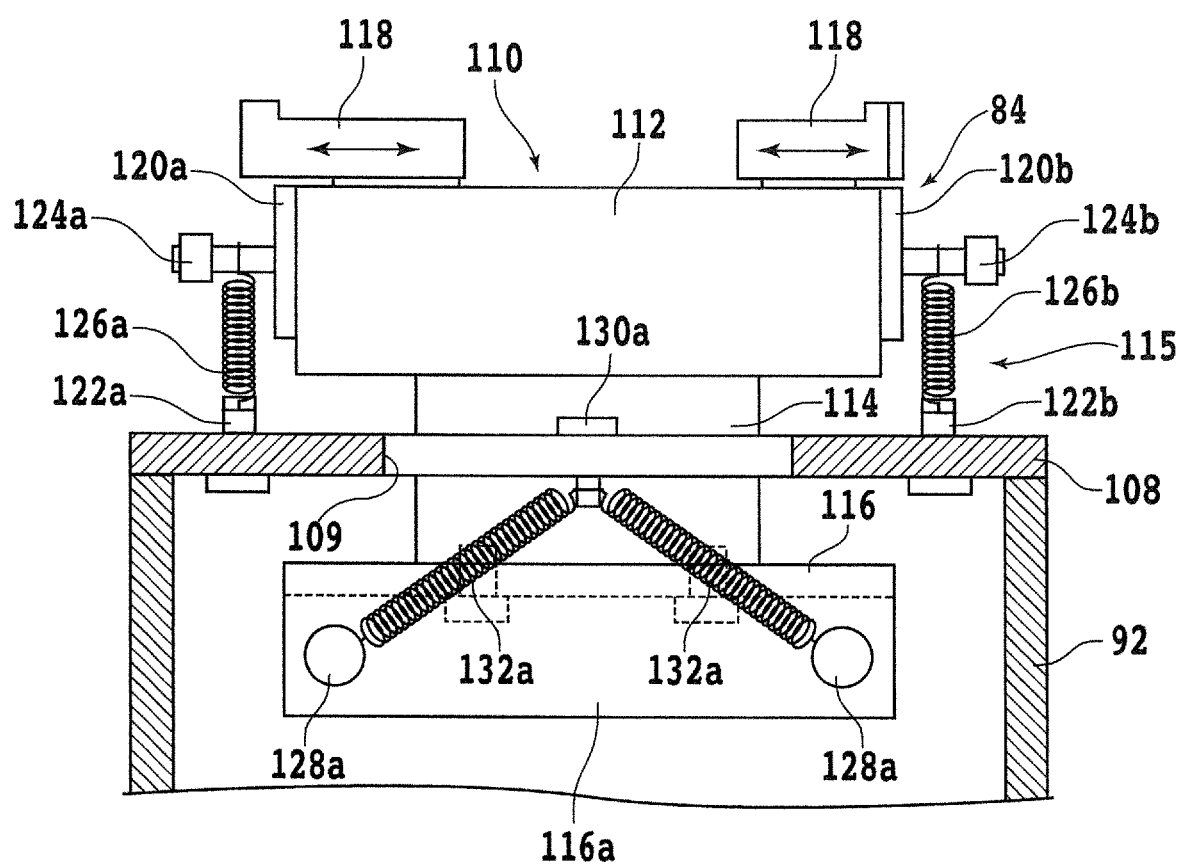
FIG. 5 is a partial cross-sectional side elevation view depicting the blade mounting and removal portion according to the first embodiment fixed in a moving portion, as viewed from a direction of an arrow A in FIG. 4.

FIG. 4 is a perspective view depicting the blade mounting and removal portion 84 of the blade changing apparatus 72. FIG. 5 is a partial cross-sectional side elevation view depicting the blade mounting and removal portion 84 fixed in the first moving portion 92, as viewed from a direction of the arrow A in FIG. 4.

A holding portion 110 of the blade mounting and removal portion 84 includes a large-diameter holding portion 112 and a small-diameter portion 114. Three grip jaws 118 are mounted in openings 113 formed in the large-diameter holding portion 112 so as to be movable in a radial direction.

Reference numeral 108 denotes an annular fixing plate. The fixing plate 108 has an inner circumferential hole 109, in which the small-diameter portion 114 of the holding portion 110 is fitted. A pair of mounting plates 120a and 120b is fixed to side surfaces of the large-diameter holding portion 112 of the holding portion 110. A pair of pins 124a is fixed in the mounting plate 120a. The pins 124a are spaced apart from each other.

As with the mounting plate 120a, a pair of pins 124b is fixed in the mounting plate 120b (see FIG. 5). Meanwhile, a pair of pins 122a and 122b is fixed in the annular fixing plate 108. The pins 122a and 122b are spaced 180° apart from each other in the rotating direction.

A pair of coil springs 126a is disposed between the pair of pins 124a, which are fixed to the mounting plate 120a, and the annular fixing plate 108. The coil springs 126a each have a bias force identical to each other. The coil springs 126a, while tensioning the holding portion 110 in opposite directions, are fixed to the fixing plate 108. The coil spring 126a and the coil spring 126b are adjusted to provide a bias force identical to each other.

Similarly, a pair of coil springs 126b is disposed between the pair of pins 124b, which are fixed to the mounting plate 120b, and the annular fixing plate 108. The coil springs 126b each have a bias force identical to each other. The coil springs 126b, while tensioning the holding portion 110 in opposite directions, are fixed to the fixing plate 108.

As depicted in FIG. 5, a U-shaped member 116 is fixed to a bottom surface of the small-diameter portion 114 of the holding portion 110. As depicted in FIG. 5, a pair of pins 128a, which are spaced apart from each other, is fixed to a lateral portion 116a on a first side of the U-shaped member 116. Similarly, a pair of pins 128b, which are spaced apart from each other, is fixed to a lateral portion 116b on a second side of the U-shaped member 116.

A pair of pins 130a and 130b, which are spaced 180° apart from each other in the rotating direction, is fixed to the annular fixing plate 108. As is evident from FIG. 5, a pair of coil springs 132a is disposed between the pair of pins 128a, which are fixed to the lateral portion 116a on the first side of the U-shaped member 116, and the pin 130a fixed to the annular fixing plate 108.

Similarly, a pair of coil springs 132b is coupled between the pair of pins 128b, which are fixed to the lateral portion 116b on the second side of the U-shaped member 116, and the pin 130b fixed to the annular fixing plate 108.

It is here noted that the coil springs 132a each have a bias force (spring force) identical to each other and the coil springs 132b each have a bias force (spring force) identical to each other. The coil springs 132a, while tensioning in opposite directions, cause the small-diameter portion 114 of the holding portion 110 to be fixed to the annular fixing plate 108. Similarly, the coil springs 132b, while tensioning in opposite directions on the side opposite to the coil springs 132a, cause the small-diameter portion 114 of the holding portion 110 to be fixed to the annular fixing plate 108. The coil springs 132a and the coil springs 132b are adjusted to provide a bias force identical to each other.

FIG. 5 is a cross-sectional view on the arrow A in FIG. 4. The four coil springs 126a and 126b provided at superior positions in FIG. 5 and the four coil springs 132a and 132b provided at inferior positions in FIG. 5 are disposed in directions mutually orthogonal to each other. The coil springs 126a, 126b, 132a, and 132b cause the holding portion 110 to be fixed to the fixing plate 108 in an aerially supported state and constitute a coupling mechanism 115 capable of freely tilting.

As depicted in FIG. 5, the annular fixing plate 108 is fixed to a distal end of the first moving portion 92 by a screw not depicted. Thus, because the coupling mechanism 115 couples the large-diameter holding portion 112 with the first moving portion 92 freely tiltably with respect to the first moving portion 92, forces of the coil springs 126a, 126b, 132a, and 132b constituting the coupling mechanism 115 balance each other, so that the coupling mechanism 115 can support the large-diameter holding portion 112 tiltably and aerially.

Figure 6:
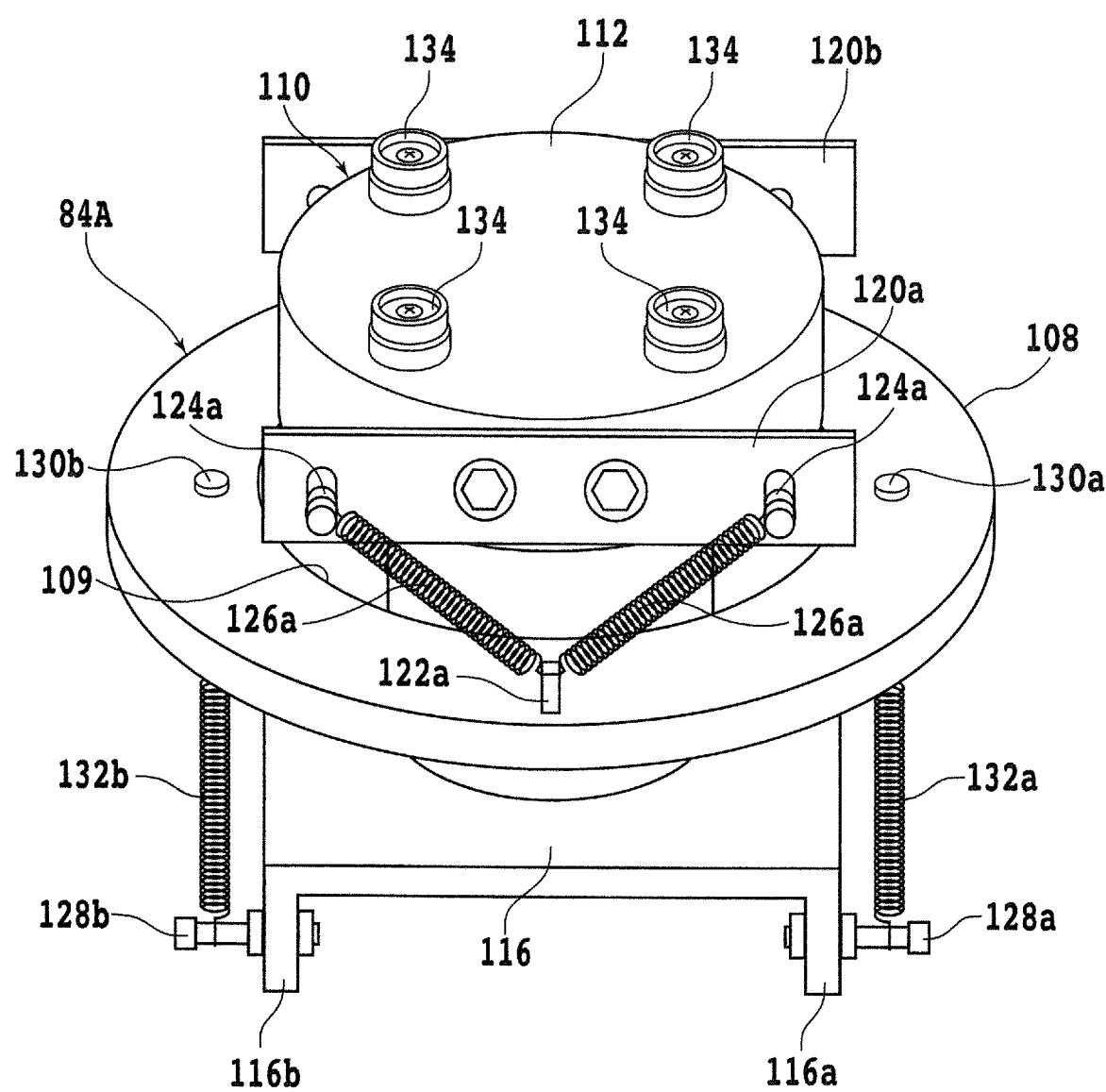
FIG. 6 is a perspective view depicting a blade mounting and removal portion according to a second embodiment.

FIG. 6 is a perspective view depicting a blade mounting and removal portion 84A according to a second embodiment of the present invention. In the second embodiment, the large-diameter holding portion 112 of the holding portion 110 is provided with four suction cups (suction portions) 134 instead of the grip jaws 118 in the first embodiment depicted in FIGS. 4 and 5.

The suction cups 134 suction and hold the circular base 66a of the cutting blade 66. Configurations of the blade mounting and removal portion 84A in the second embodiment are otherwise identical to the configurations of the blade mounting and removal portion 84 in the first embodiment. Like reference numerals identify like components and descriptions for those components will be omitted.

Figure 7:
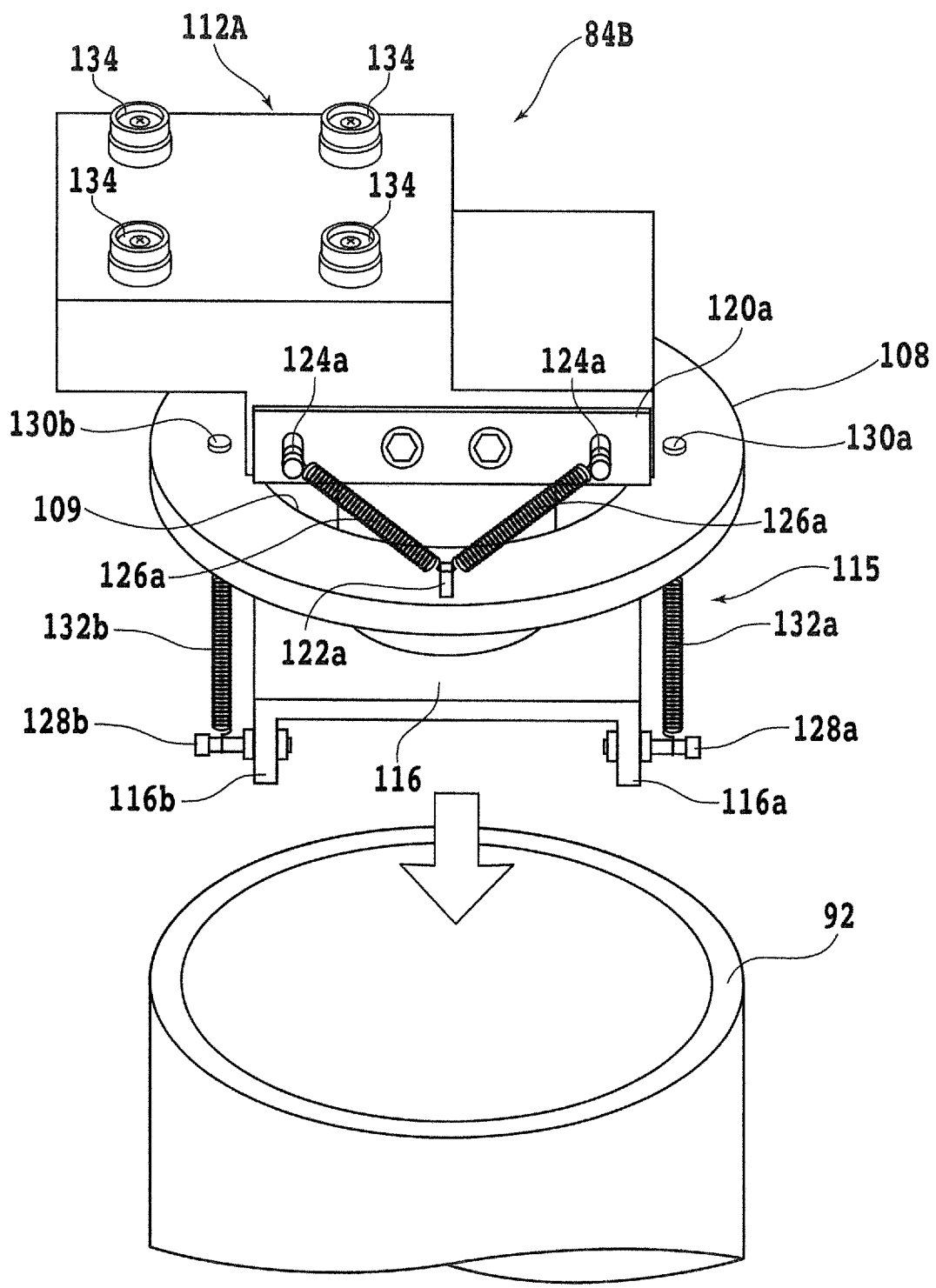
FIG. 7 is a perspective view depicting a blade mounting and removal portion according to a third embodiment.

FIG. 7 is a perspective view depicting a blade mounting and removal portion 84B according to a third embodiment of the present invention. The blade mounting and removal portion 84B in the third embodiment represents a holding portion 112A, on which the suction cups 134 are mounted, offset to one side from a center of the blade mounting and removal portion 84B. Even with such a configuration, the coupling mechanism 115, which couples the holding portion 112A with the first moving portion 92 freely tiltably with respect to the first moving portion 92, acts effectively.

The third embodiment is effective for a configuration in which, because of interference with an existing part of the cutting apparatus, for example, the holding portion 112 of the blade changing apparatus 72 cannot be disposed at the center of the blade mounting and removal portion 84A as depicted in FIG. 6. There may be a configuration in which the grip jaws 118 are provided instead of the suction cups 134.

Figure 8:
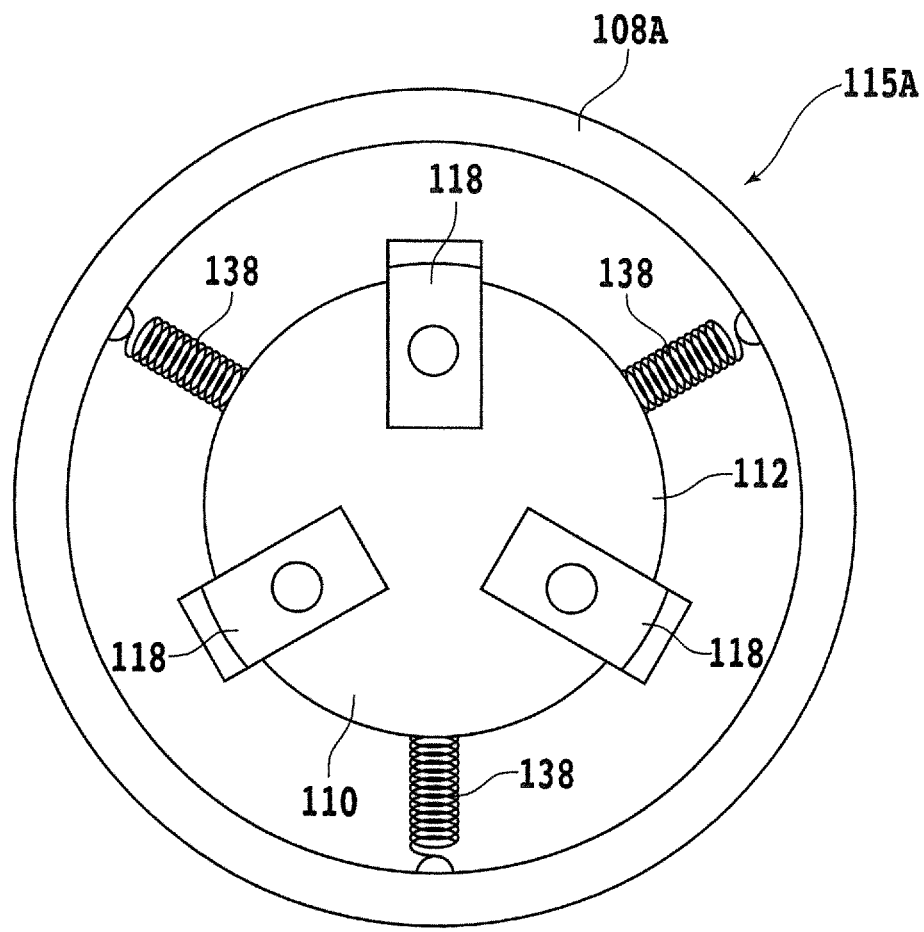
FIG. 8 is a schematic view depicting a coupling mechanism of a blade mounting and removal portion according to a fourth embodiment.

FIG. 8 is a schematic view depicting a coupling mechanism 115A, which freely tiltably couples the holding portion 110 of a fourth embodiment with a fixing member 108A fixed to a moving portion 90. The coupling mechanism 115A in the fourth embodiment freely tiltably couples the holding portion 110 with the fixing member 108A using three coil springs 138, which are spaced 120° apart from each other in a circumferential direction. Even with such a configuration, forces acting from the three coil springs 138 balance each other, so that the holding portion 110 can be tiltably and aerially supported.

Figure 9:
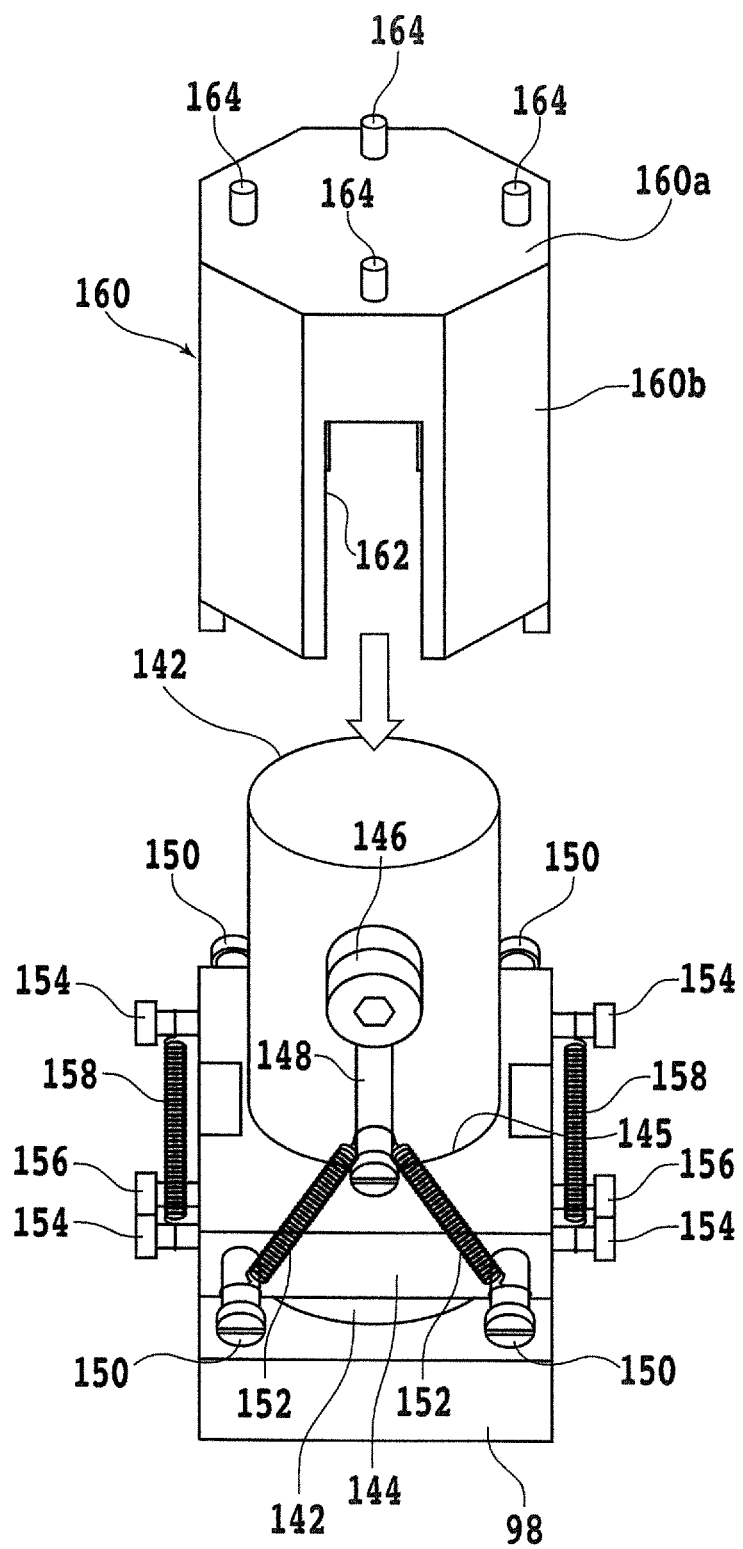
FIG. 9 is an exploded perspective view depicting a nut rotation portion.
Figure 10A:
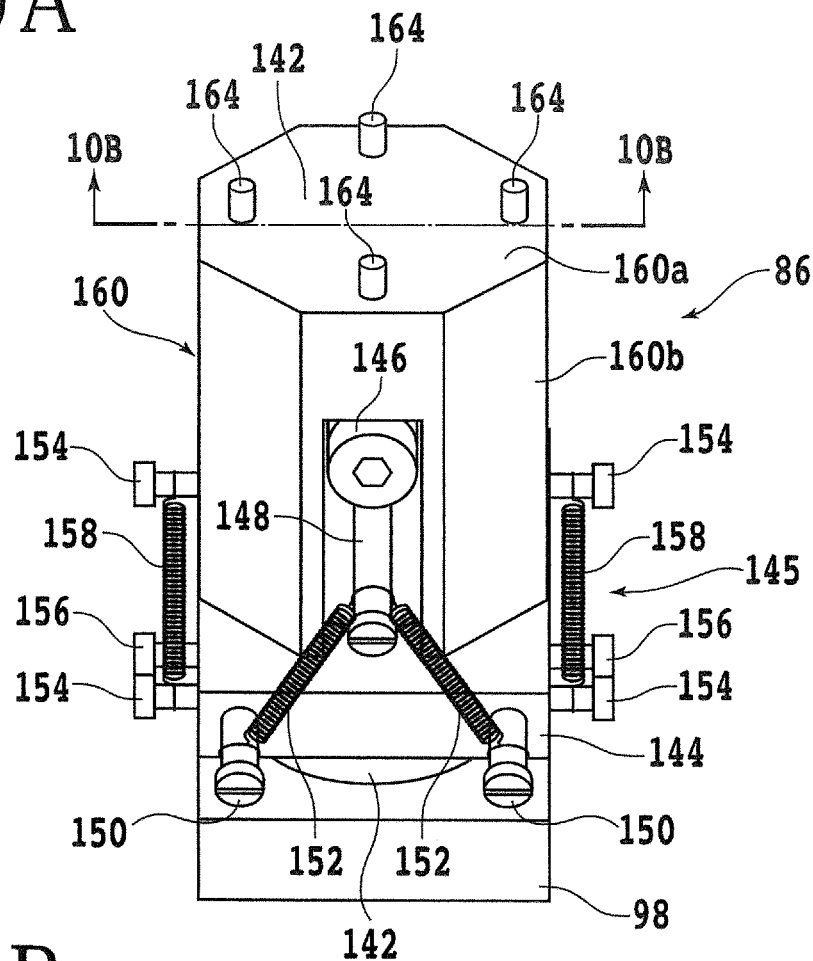
FIG. 10A is a perspective view depicting the nut rotation portion.
Figure 10B:
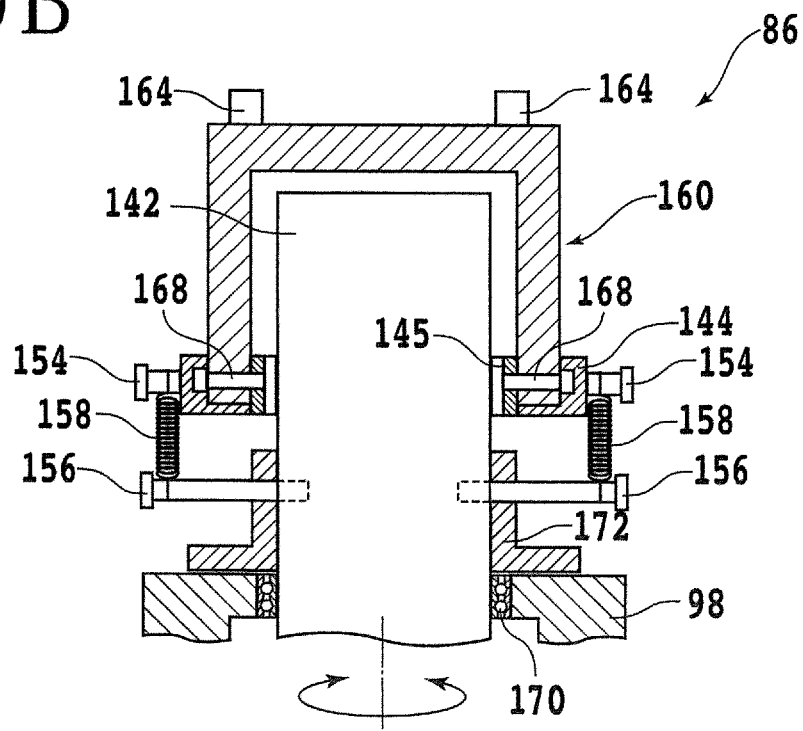
FIG. 10B is a cross-sectional view taken along line 10B-10B in FIG. 10A.
Figure 11:
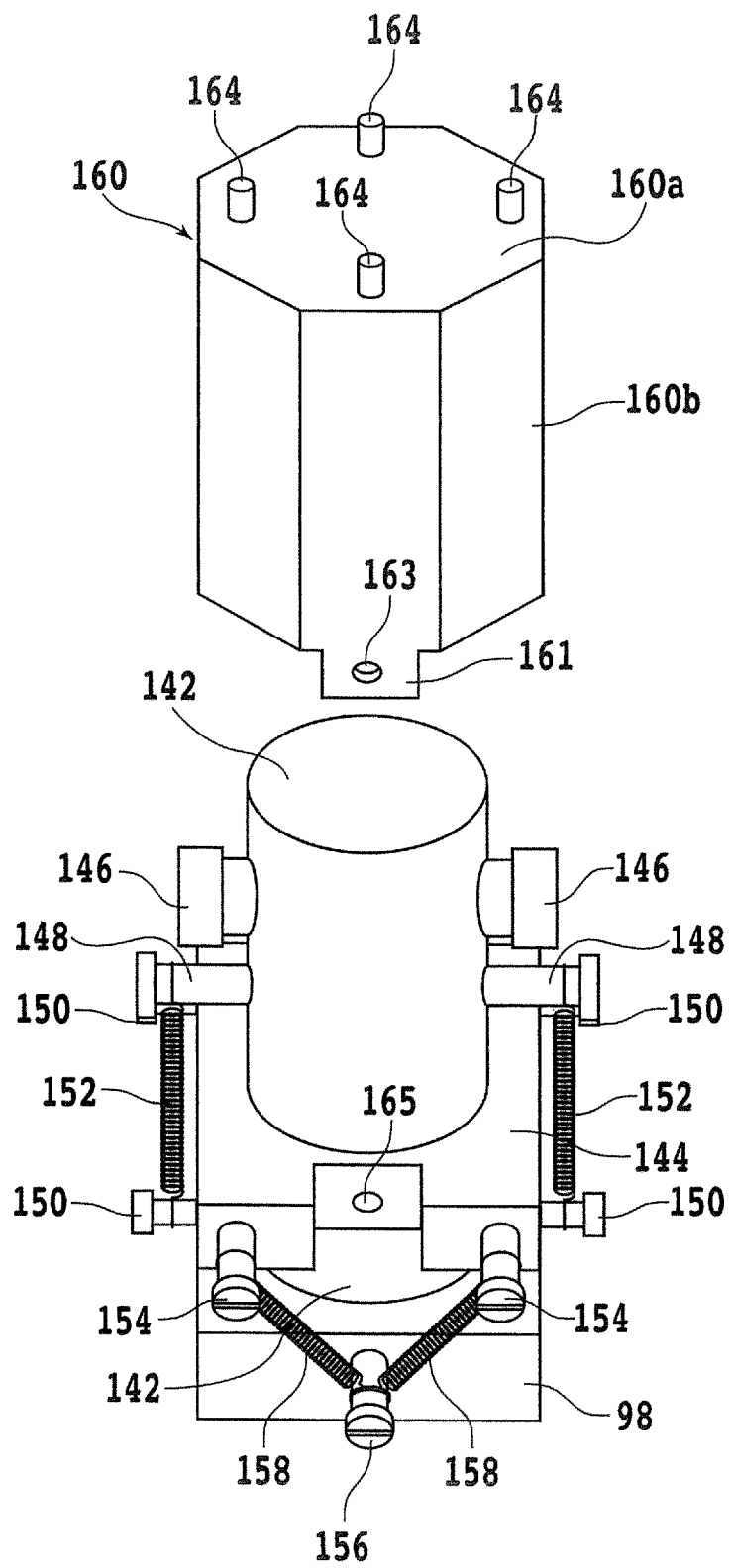
FIG. 11 is an exploded perspective view depicting the nut rotation portion rotated through 90° from the condition depicted in FIG. 9.
Figure 12A:
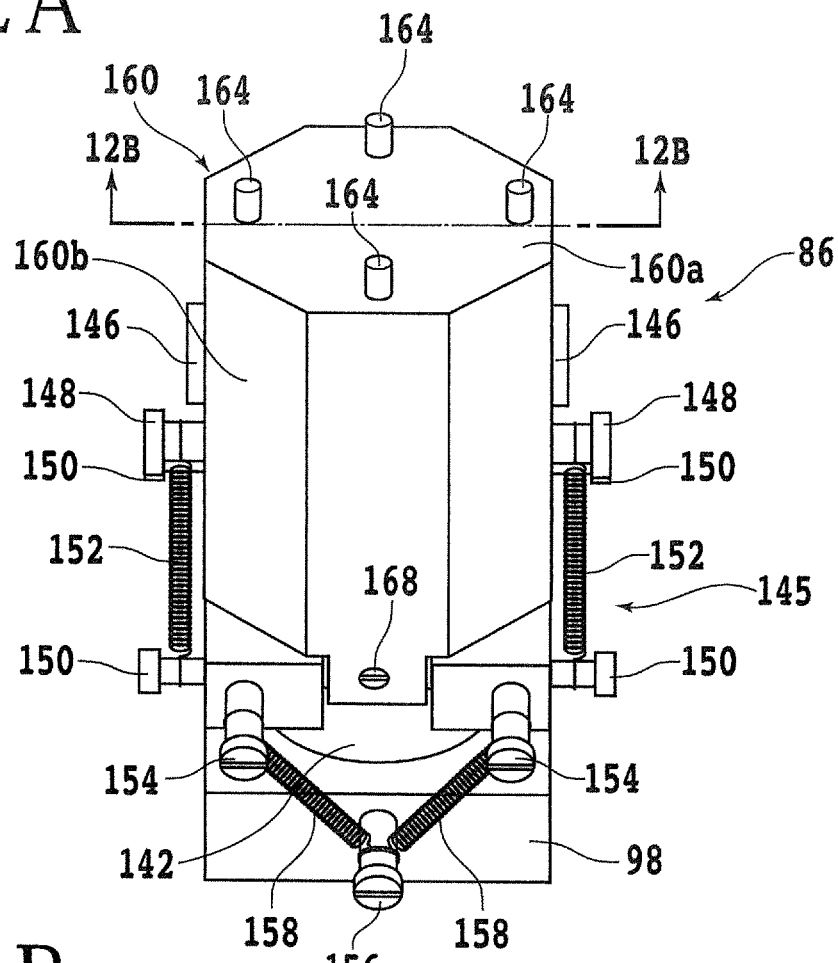
FIG. 12A is a perspective view depicting the nut rotation portion rotated through 90° from the condition depicted in FIG. 10A.
Figure 12B:
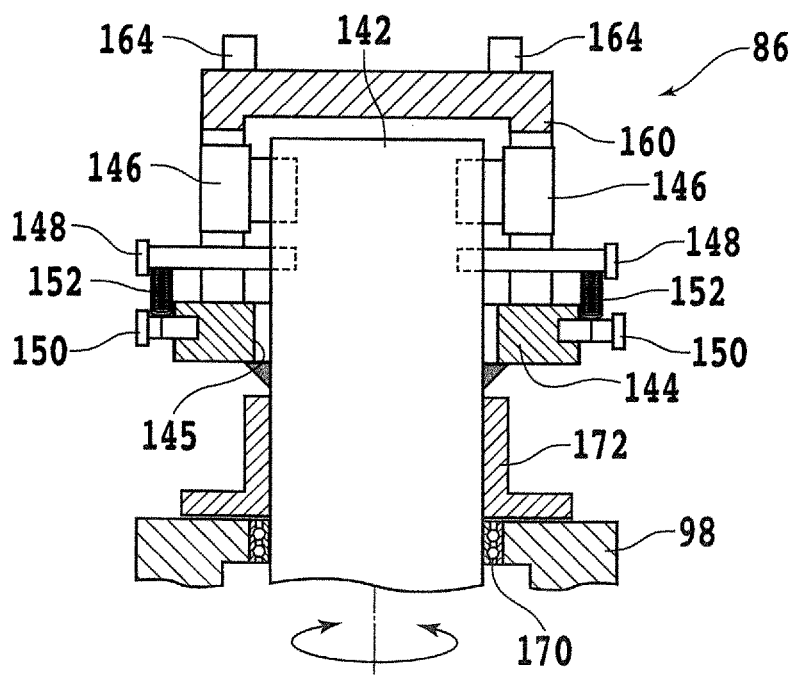
FIG. 12B is a cross-sectional view taken along line 12B-12B in FIG. 12A.

A detailed configuration of the nut rotation portion 86 will be described below with reference to FIGS. 9 to 12B. FIG. 9 is an exploded perspective view depicting the nut rotation portion 86. FIG. 10A is a perspective view depicting the nut rotation portion 86. FIG. 10B is a cross-sectional view taken along line 10B-10B in FIG. 10A. FIG. 11 is an exploded perspective view depicting the nut rotation portion 86 rotated through 90° from the condition depicted in FIG. 9. FIG. 12A is a perspective view depicting the nut rotation portion 86 rotated through 90° from the condition depicted in FIG. 10A. FIG. 12B is a cross-sectional view taken along line 12B-12B in FIG. 12A.

Reference numeral 142 denotes a rotary shaft. As depicted in FIG. 10B, the rotary shaft 142 is mounted rotatably at a distal end of the moving portion 98 via a bearing 170. In the present embodiment, the moving portion 98 is movable in the Y-axis direction in FIGS. 1 and 2 by the air cylinder 96 and a motor disposed inside the moving portion 98 rotates the rotary shaft 142.

Reference numeral 144 denotes an apertured plate having an opening 145. As is best depicted in FIG. 10B, the rotary shaft 142 is disposed in the apertured plate 144. A pair of abutment pins 146 is fixed to the rotary shaft 142. The abutment pins 146 are spaced 180° apart from each other in the circumferential direction.

Reference numeral 160 denotes a jacket. The jacket 160 includes a holding portion 160*a* and a lateral portion 160*b*. The four pins 164 are fixed to the holding portion 160*a*. The lateral portion 160*b* has a pair of openings 162. The abutment pins 146 are inserted in the respective openings 162.

Place the jacket 160 over the rotary shaft 142 as depicted in FIG. 9 and fix the jacket 160 to the apertured plate 144 with a pair of screws 168 as depicted in FIG. 10B. The foregoing steps allow the jacket 160 to be moved integrally with the apertured plate 144.

More specifically, as depicted in FIG. 11, the jacket 160 has protrusions 161. The protrusions 161 each have a threaded hole 163 formed therein. The apertured plate 144 has a round hole 165 formed therein. Insert the screw 168 in the round hole 165 and threadedly engage the screw 168 with the threaded hole 163 in the jacket 160. The foregoing step causes the jacket 160 to be fixed to the apertured plate 144. Reference numeral 172 depicted in FIGS. 10B and 12B denotes a seal that is fixed in the rotary shaft 142 to thereby hermetically seal the bearing 170.

As is best depicted in FIGS. 9 and 11, a pair of pins 148, which are spaced 180° apart from each other in the circumferential direction, are fixed to the rotary shaft 142. Furthermore, as is best depicted in FIG. 10B, a pair of pins 156, which are spaced 180° apart from each other in the rotating direction, are fixed to the rotary shaft 142.

As is best depicted in FIGS. 10A and 12B, a pair of pins 150, which are spaced apart laterally the rotary shaft 142, is fixed to the apertured plate 144, specifically, a total of four pins 150 are fixed to the apertured plate 144. A coil spring 152 is fitted across each of the pins 148, which are fixed to the rotary shaft 142, and each of the pins 150, which are fixed to the apertured plate 144.

The coil springs 152, provided in pairs, are each set to have a bias force (spring force) identical to each other. The coil springs 152 each fix the jacket 160, which includes the holding portion 160*a* and which is integrated with the apertured plate 144, to the moving portion 98 while tensioning the jacket 160 in opposite directions. Additionally, as is best depicted in FIGS. 11 and 12A, a pair of pins 154, which are spaced apart laterally the rotary shaft 142, is fixed to the apertured plate 144, specifically, a total of four pins 154 are fixed to the apertured plate 144. The four pins 154 are spaced 90° apart from the abovementioned respective four pins 150.

A coil spring 158 is fitted across each of the pins 156, which are fixed to the rotary shaft 142, and each of the pins 154, which are fixed to the apertured plate 144. The coil springs 152 and 158 each fix the holding portion 160*a* of the jacket 160 to the moving portion 98 freely tiltably, while tensioning the holding portion 160*a* in opposite directions. Specifically, forces of the springs 152 and 158, which constitute a coupling mechanism 145, balance each other to thereby tiltably and aerially support the holding portion 160*a* of the jacket 160.

It is noted that, while FIGS. 9, 10A, 11, and 12A depict the second moving portion 98 only schematically, the second moving portion 98 actually has a cylindrical shape as depicted in FIGS. 2, 10B, and 12B.

The jacket 160 can tilt or rotate relative to the rotary shaft 142 freely within a range over which the coil springs extend. When the fixing nut 70 is rotated, however, the rotation of the jacket 160 relative to the rotary shaft 142 needs to be restricted in order to transmit the rotational force of the rotary shaft 142 to the pins 164.

Rotation of the rotary shaft 142 causes the abutment pins 146 to abut on sides in the openings 162 in the jacket 160, so that the rotational force of the rotary shaft 142 can be directly transmitted to the jacket 160 without having the coil springs intervening.

Operation and effects of the blade changing apparatus 72, which has been detailed above, will be described below. To change the cutting blade 66 fixed at the spindle distal end portion 50, the blade changing apparatus moving mechanism 78 is first driven and the nut rotation portion 86 of the blade changing apparatus 72 is aligned with the spindle distal end portion 50 along an identical axis.

Under the above condition, the air cylinder 96 is activated to thereby extend the moving portion 98 in the Y-axis direction depicted in FIGS. 1 and 2. Additionally, the rotary shaft 142 is rotated slightly by the motor to thereby insert the pins 164 fitted on the holding portion 160*a* into the pin holes 76 in the fixing nut 70.

Because the coupling mechanism 145, which is composed of the coil springs 152 and 158, supports the holding portion 160*a* freely tiltably, the pins 164 of the nut rotation portion 86 slide into the pin holes 76 in the fixing nut 70 even when the rotary shaft 142 is slightly offset angularly or positionally from the axis of the boss 56. The rotary shaft 142 is rotated by the motor under the condition in which the pins 164 rest in the pin holes 76 in the fixing nut 70. The fixing nut 70, which is threaded engaged with the boss 56, can then be readily removed from the boss 56 of the blade mount 54.

After the fixing nut 70 has been removed, the blade changing apparatus 72 is moved in the X-axis direction to thereby bring the blade mounting and removal portion 84 into alignment with an axis of the spindle distal end portion 50. The moving portion 92 is then moved by the air cylinder 90 in the Y-axis direction, the circular base 66*a* of the cutting blade 66 is clamped by the grip jaws 118, and the cutting blade 66 is removed from the blade mount 54.

To remove the cutting blade 66, bring the grip jaws 118 opened in the radial direction into abutment with the circular base 66*a* of the cutting blade 66 mounted in the blade mount 54 and then move the grip jaws 118 inwardly in the radial direction. This enables the grip jaws 118 to readily clamp the circular base 66*a* of the cutting blade 66.

FIGS. 1 and 2 depict a condition of the blade changing apparatus 72, in which the removed fixing nut 70 is held by the nut rotation portion 86 and the removed cutting blade 66 is to be mounted on the cylindrical protrusion 104 of the blade rack 100.

After the removed cutting blade 66 has been mounted on the cylindrical protrusion 104, the blade changing apparatus moving mechanism 78 is driven, the blade mounting and removal portion 84 is caused to face the cylindrical protrusion 102 on which a new cutting blade 66 is mounted, and the new cutting blade 66 is withdrawn from the cylindrical protrusion 102 with the circular base 66a of the cutting blade 66 clamped by the grip jaws 118 of the blade mounting and removal portion 84.

The blade changing apparatus moving mechanism 78 is then driven, thereby to move the blade changing apparatus 72 in the X-axis direction and to cause the blade mounting and removal portion 84 to face the spindle distal end portion 50. Under the foregoing condition, the air cylinder 90 is driven, thereby to move the moving portion 92 in the Y-axis direction and to mount the new cutting blade 66 clamped by the grip jaws 118 onto the boss 56 of the blade mount 54.

Even when, at this time, the cutting blade 66 held by the holding portion 112 tilts slightly relative to the boss 56 of the blade mount 54, because of the holding portion 112 aerially held by the tiltable coupling mechanism 115, the angle of the insertion hole 66b in the cutting blade 66, which is about to be mounted along the boss 56 of the blade mount 54, is adjusted with no special intervention, so that the cutting blade 66 can be mounted on the boss 56 of the blade mount 54 without binding.

Once the new cutting blade 66 has been mounted on the boss 56 of the blade mount 54, the fixing nut 70 held by the nut rotation portion 86 of the blade changing apparatus 72 is threadedly engaged with the external thread 60 formed on the boss 56 of the blade mount 54 and is tightened. The cutting blade 66 is thereby fixed on the blade mount 54.

When the cutting blade is mounted on, or removed from, the blade mount, the cutting unit moving mechanism 22, instead of the moving portion 92, may be driven to thereby advance the blade mount toward, or retract the blade mount from, a first holding portion of the blade changing apparatus.

Similarly, when the fixing nut is mounted on, or removed from, the blade mount, the cutting unit moving mechanism 22 may be driven to thereby advance the blade mount toward, or retract the blade mount from, a second holding portion. The configuration as mentioned above eliminates the moving portion of the blade changing apparatus, so that reduction in cost and possible faulty spots can be achieved.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A cutting apparatus, comprising:
   a cutting unit that cuts a workpiece held by a chuck table with a cutting blade fixed to a blade mount mounted at a distal end of a spindle;
   a moving mechanism that moves the cutting unit in an axial direction of the spindle; and
   a blade changing apparatus that removes the cutting blade from, and mounts the cutting blade on, the blade mount to thereby exchange the cutting blades, the cutting blade including a circular base having an insertion hole at a center thereof and a cutting edge fixed to an outer circumferential edge of the circular base, wherein
   the blade mount includes:
      a boss that is passed through the insertion hole in the cutting blade and extends in the axial direction of the spindle; and
      a flange that integrally protrudes in a radial direction from the boss at a position posterior to the boss and on which the cutting blade abuts, and
   the blade changing apparatus includes a blade mounting and removal portion that includes:
      a first holding portion that removably holds the circular base of the cutting blade;
      a moving support portion that supports the first holding portion and moves the first holding portion to a removal and mounting position at which the insertion hole in the cutting blade faces the boss of the blade mount; and
      a first coupling mechanism that couples the first holding portion with the moving support portion such that the first holding portion is freely tiltable with respect to the moving support portion, the first coupling mechanism including a plurality of first elastic member pairs, each pair, while tensioning the first holding portion in opposite directions, fixing the first holding portion to the moving support portion, forces acting from the first elastic member pairs balancing each other to thereby support the first holding portion tiltably and aerially.

2. The cutting apparatus according to claim 1, wherein the moving support portion includes a first moving portion that advances or retracts the first holding portion, in which the insertion hole in the cutting blade faces the boss of the blade mount, in a direction in parallel with the axial direction of the boss to thereby fit the cutting blade into the boss or remove the cutting blade from the boss, and
the first holding portion is coupled with the first moving portion of the moving support portion freely tiltably by the first coupling mechanism.

3. The cutting apparatus according to claim 1, wherein the blade changing apparatus further includes a nut rotation portion that includes:
   a second holding portion that removably holds a fixing nut that fixes the cutting blade inserted in the boss of the blade mount to the boss;
   rotary means that is disposed in the moving support portion and that rotates the fixing nut fitted to the boss; and
   a second coupling mechanism that couples the second holding portion with the moving support portion freely tiltably with respect to the moving support portion.

4. The cutting apparatus according to claim 3, wherein the moving support portion includes a second moving portion that advances or retracts the second holding portion, in which the fixing nut faces the boss of the blade mount, in a direction in parallel with the axial direction of the boss to thereby fit the fixing nut over the boss or remove the fixing nut from the boss, and
the second holding portion is coupled with the second moving portion of the moving support portion freely tiltably by the second coupling mechanism.

5. The cutting apparatus according to claim 1, wherein the first elastic member pairs each include a pair of coil springs as elastic members having bias forces identical to each other and tensioning in opposite directions.

6. The cutting apparatus according to claim 1, wherein the first holding portion includes a plurality of grip jaws that clamp the circular base of the cutting blade.

7. The cutting apparatus according to claim 1, wherein the first holding portion includes a suction portion that suctions and holds the circular base of the cutting blade.

8. The cutting apparatus according to claim 1, wherein the first coupling mechanism is such that the first holding portion has an axis at a position corresponding to a center in the insertion hole in the circular base of the cutting blade held in the first holding portion.

9. The cutting apparatus according to claim 3, wherein
the fixing nut has a plurality of pin holes, and
the second holding portion of the nut rotation portion includes a plurality of pins that can be inserted in the pin holes in the fixing nut.

* * * * *